United States Patent
Yuan et al.

(10) Patent No.: US 11,695,227 B2
(45) Date of Patent: Jul. 4, 2023

(54) CONNECTOR WITH TOLERANCE MODULE

(71) Applicant: AVIC JONHON OPTRONIC TECHNOLOGY CO., LTD., Luoyangshi (CN)

(72) Inventors: Junfeng Yuan, Luoyangshi (CN); Lufei Ma, Luoyangshi (CN)

(73) Assignee: AVIC JONHON OPTRONIC TECHNOLOGY CO., LTD., Luoyangshi (CN)

( * ) Notice: Subject to any disclaimer, the term of this patent is extended or adjusted under 35 U.S.C. 154(b) by 372 days.

(21) Appl. No.: 17/044,618

(22) PCT Filed: Jul. 24, 2019

(86) PCT No.: PCT/CN2019/097417
§ 371 (c)(1),
(2) Date: Oct. 1, 2020

(87) PCT Pub. No.: WO2020/020201
PCT Pub. Date: Jan. 30, 2020

(65) Prior Publication Data
US 2021/0075134 A1 Mar. 11, 2021

(30) Foreign Application Priority Data
Jul. 27, 2018 (CN) .......................... 201810847131.1

(51) Int. Cl.
*H01R 12/71* (2011.01)
*H01R 13/46* (2006.01)
*H01R 13/631* (2006.01)

(52) U.S. Cl.
CPC ........... *H01R 12/716* (2013.01); *H01R 13/46* (2013.01); *H01R 13/6315* (2013.01)

(58) Field of Classification Search
CPC .. H01R 13/6315; H01R 13/46; H01R 13/716; H01R 13/514
(Continued)

(56) References Cited

U.S. PATENT DOCUMENTS 5,320,559 A * 6/1994 Uratsuji ............... H05K 7/1069
324/755.05
5,556,286 A * 9/1996 Ikesugi ............... H01R 12/716
439/31
(Continued)

FOREIGN PATENT DOCUMENTS

CN 102201624 A 9/2011
CN 102544794 A 7/2012
(Continued)

OTHER PUBLICATIONS

First Office Action issued in corresponding Chinese Patent Application No. No: 201810847131.1; dated Jan. 10, 2020; 14 pgs.
(Continued)

*Primary Examiner* — Marcus E Harcum
(74) *Attorney, Agent, or Firm* — Hauptman Ham, LLP

(57) ABSTRACT

A connector with a tolerance module includes a socket and a plug adapted to the socket, wherein the socket includes a first housing, the plug includes a tolerance module and a third housing, the tolerance module includes a second housing, the second housing includes second contact members, the second housing is movably arranged on the third housing in a direction perpendicular to the axial direction of the connector, and the second contact members are floatingly assembled in the second housing to enable displacement in the direction perpendicular to the axial direction of the connector. The second housing only generates translational motion without displacement when the connector is inserted. The tolerance of the plug and the socket is realized by the (Continued)

floating assembly of the second contact members in the second housing.

11 Claims, 9 Drawing Sheets

(58) Field of Classification Search
USPC ............... 439/246, 247, 248, 65, 66, 74
See application file for complete search history.

(56) References Cited

U.S. PATENT DOCUMENTS

| | | | | |
|---|---|---|---|---|
| 6,347,950 | B1* | 2/2002 | Yokoyama | H01R 13/6315 |
| | | | | 439/62 |
| 6,699,054 | B1* | 3/2004 | Critelli | H01R 24/50 |
| | | | | 439/63 |
| 6,848,925 | B2* | 2/2005 | Nishide | H01R 13/73 |
| | | | | 439/157 |
| 6,932,637 | B2* | 8/2005 | Ewers | H05K 3/301 |
| | | | | 439/247 |
| 7,234,950 | B1* | 6/2007 | Wickett | H01R 13/504 |
| | | | | 439/247 |
| 7,445,467 | B1 | 11/2008 | Matsuo | |
| 8,177,587 | B2* | 5/2012 | Takagi | H01R 13/113 |
| | | | | 439/74 |
| 8,360,789 | B2* | 1/2013 | Yin | H01R 12/91 |
| | | | | 439/66 |
| 8,465,312 | B2* | 6/2013 | Di Stefano | H01R 4/48 |
| | | | | 439/248 |
| 8,734,167 | B2* | 5/2014 | Aimoto | H01R 12/91 |
| | | | | 439/74 |
| 8,801,459 | B2* | 8/2014 | Mrowka | H01R 24/50 |
| | | | | 439/246 |
| 8,821,174 | B2* | 9/2014 | Kimura | H01R 13/6315 |
| | | | | 439/570 |
| 8,888,519 | B2* | 11/2014 | Baumler | H01R 13/6315 |
| | | | | 439/248 |
| 9,039,433 | B2* | 5/2015 | Barthelmes | H01R 24/542 |
| | | | | 439/248 |
| 9,337,577 | B1* | 5/2016 | Hitchcock | H01R 13/6315 |
| 9,478,889 | B2* | 10/2016 | Oshida | H01R 13/6585 |
| 9,614,309 | B1 | 4/2017 | Miklinski, Jr. et al. | |
| 2004/0253862 | A1* | 12/2004 | Masaki | H01R 12/7023 |
| | | | | 439/247 |
| 2005/0048824 | A1* | 3/2005 | Horikoshi | H01R 13/24 |
| | | | | 439/246 |
| 2015/0071675 | A1* | 3/2015 | Suzaki | G03G 15/80 |
| | | | | 439/247 |
| 2015/0132976 | A1* | 5/2015 | Sato | H01R 13/2457 |
| | | | | 439/74 |
| 2016/0118736 | A1* | 4/2016 | Hoyack | H01R 24/542 |
| | | | | 439/246 |
| 2016/0164233 | A1* | 6/2016 | Zhu | H01R 24/50 |
| | | | | 439/248 |
| 2016/0204536 | A1* | 7/2016 | Doi | H01R 12/716 |
| | | | | 439/248 |
| 2016/0380374 | A1* | 12/2016 | Singhammer | H01R 4/48 |
| | | | | 439/247 |
| 2017/0256876 | A1* | 9/2017 | Zhou | H01R 13/2435 |
| 2018/0040983 | A1* | 2/2018 | Matsumoto | H01R 13/6315 |

FOREIGN PATENT DOCUMENTS

| | | |
|---|---|---|
| CN | 103337733 A | 10/2013 |
| CN | 204577732 U | 8/2015 |
| CN | 105896145 A | 8/2016 |
| CN | 205790554 U | 12/2016 |
| CN | 109616799 A | 4/2019 |

OTHER PUBLICATIONS

Second Office Action issued in corresponding Chinese Patent Application No. No: 201810847131.1; dated Jun. 30, 2020; 8 pgs.
International Search Report issued in corresponding International Application No. PCT/CN2019/097417, dated Oct. 24, 2019; 6 pgs.
Written Opinion issued in corresponding International Application No. PCT/CN2019/097417, dated Oct. 24, 2019; 3 pgs.

* cited by examiner

CONNECTOR WITH TOLERANCE MODULE

RELATED APPLICATIONS

The present application is a National Phase of International Application Number PCT/CN2019/097417 filed Jul. 24, 2019 and claims priority to Chinese Application Number 201810847131.1 filed Jul. 27, 2018.

TECHNICAL FIELD

The present invention relates to a connector with a tolerance module.

BACKGROUND ART

The application of connectors is common, and plays an important role on some special occasions, such as connectors adopted in CPCI (compact peripheral component interconnect) buses, new PCIE (peripheral component interconnect express) buses and ATCA (advanced telecom computing architecture) communication computing systems that are widely applied in the civilian and military fields. PCI (peripheral component interconnect) bus-based high-speed backplane connectors are mainly applied in two fields: 1. the data network field, including enterprise routers, converters, memories, servers, supercomputers, etc.; 2. the wireless communication field, including communication base stations, core routers, converters and the like. Important connectors that are widely applied in the fields above are board-to-board connectors, which are small in structure and applicable to intensive assembly environments. However, due to the influence of factors such as assembly error and product error, when two mutually adapted modules of one connector assembly are used, displacement relative to the designed position tends to occur, and the displacement includes not only the displacement in the plugging direction, but also the displacement perpendicular to the plugging direction, leading to higher requirements on the tolerance of the connector. Taking a common high-speed connector as an example, this type of connector is generally a differential connector, and has strict requirements on transmission speed, quality, density, etc. of signals; at present, the deviation of the connector in a large plugging direction can reach 1.0 mm, the deviation perpendicular to the plugging direction can reach 0.6 mm, and how to ensure stable transmission of the connector under the above-mentioned deviation degree becomes a critical factor affecting the performance of the connector.

Existing connector assemblies are mostly of a three-piece type, including a plug, a socket and a tolerance module connected between the plug and the socket, wherein the tolerance module forms an adapter, and the plug, the socket and the tolerance module are arranged separately. When using the connector, a user needs to connect the tolerance module between the plug and the socket, of which the separation force needs to be appropriately designed so as to prevent the tolerance module from falling off or failing to stay on the set plug or socket as expected during separation. Also existing in the prior art is a type of two-piece connector with a tolerance module, for example, a radio frequency coaxial connector disclosed in Chinese Patent Application Publication No. CN 10333773 3 A, which comprises a socket and a plug connected by insertion to the socket, wherein the socket comprises a first housing, a first inner conductor and a first insulator, the plug comprises a second housing and a third housing, the second housing and the third housing are provided with second contact members and third contact members respectively, the second housing and the second contact members form a tolerance module, and springs and a gap for realizing floating in the radial direction and the axial direction are arranged between the second housing and the third housing. However, if the radio frequency coaxial connector is used as a differential connector, due to the large number of the contact members, the displacement of the second housing will drive all the second contact members to displace at the same time, and the degree of displacement of the different second contact members will be different due to the different positions of the displacement axes, which will have a large impact on the transmission performance of high-density connectors such as the differential connector.

SUMMARY OF THE INVENTION

The present invention aims to provide a connector with a tolerance module to solve the problem that existing connectors are large in difference in the degree of displacement of different contact members during displacement insertion to result in affecting the transmission performance.

The technical solution adopted by the connector with the tolerance module in the present invention is as follows.

A connector with a tolerance module, comprising a socket and a plug adapted to the socket, the socket comprising a first housing, the plug comprising a tolerance module and a third housing, the tolerance module comprising a second housing, the second housing being internally provided with second contact members, the second housing being movably arranged on the third housing in a direction perpendicular to the axial direction of the connector, the second contact members being floatingly assembled in the second housing to enable displacement in the direction perpendicular to the axial direction of the connector.

The present invention has the advantages that, by adopting the above-mentioned technical solution, the second housing is movably arranged on the third housing in a direction perpendicular to the axial direction of the connector, the second housing only generates translational motion in the direction perpendicular to the axial direction of the connector without displacement when the connector is inserted; the tolerance between the plug and the socket can be realized by the floating assembly of the second contact members in the second housing. Compared with the prior art in which the second housing drives all the second contact members to displace, the present invention can improve the discrepancy in the degree of displacement of different second contact members and be beneficial to improving the transmission performance of the connector.

As a preferred technical solution, the second contact members are provided with a stopping boss, the second housing comprises a limiting seat disposed on one side of the stopping boss away from the third housing, a supporting seat is disposed on one side of the stopping boss away from the limiting seat, through holes for allowing the second contact members to pass through in a floating manner are formed in the limiting seat and the supporting seat, and the stopping boss is limited between the limiting seat and the supporting seat.

The limiting seat and the supporting seat are simple in structure and facilitate control of the floating of the second contact members.

As a preferred technical solution, based on the limiting seat and the supporting seat, the stopping boss is sandwiched between the limiting seat and the supporting seat, and the supporting seat is elastically supported on the stopping boss of the second contact members.

The supporting seat that is elastically supported can further improve the consistency of the displacement degree of the second contact members, and can to some extent adapt to axial floating and improve the capability of axial tolerance.

As a preferred technical solution, on the basis that the stopping boss is sandwiched between the limiting seat and the supporting seat, the supporting seat and the limiting seat are separately arranged, an axially floating space is formed between the supporting seat and the third housing, elastic supporting members are arranged between the supporting seat and the third housing, and the supporting seat is elastically supported on the stopping boss of the second contact members by means of the elastic supporting members.

The elastic supporting member facilitate assembly and are simple in structure.

As a preferred technical solution, the elastic supporting members are elastic pieces uniformly fixed on the supporting seat.

The elastic pieces fixed on the supporting seat can reduce the number of components and improve the assembling efficiency.

As a preferred technical solution, based on the limiting seat and the supporting seat, one side of the supporting seat close to the third housing is provided with elastic member accommodating grooves for partially embedding the elastic supporting members.

The provided elastic member accommodating grooves can reduce the thickness on the basis of ensuring the strength of the supporting seat so as to avoid over large axial dimension of the second housing and further to avoid affecting the translational motion of the second housing.

As a preferred technical solution, based on the limiting seat and the supporting seat, the limiting seat comprises a plate body and connecting blocks disposed on opposite sides of the plate body, the two connecting blocks are connected to the plate body in the middle of the axial direction of the connector, and the second contact members penetrate through the plate body.

Cooperation between the second contact members and the plate body of the limiting seat facilitates floating of the second contact members.

As a preferred technical solution, based on the limiting seat and the supporting seat, the stopping boss is disposed in the middle of the length direction of the second contact members.

The positioning of the stopping boss in the middle of the length direction of the second contact member helps ensure the floating amount at both ends of the second contact members, and enables every second contact members in a free state to be more stable in the second housing, thereby further ensuring the consistency of the contact members.

As a preferred technical solution, on the basis that the stopping boss is disposed in the middle of the length direction of the second contact members, the supporting seat is a supporting plate, the portion of each second contact member, which fits with the through holes on the plate body and the supporting plate, is a reduced section, and the radial dimension of the side of the reduced section that is close to the stopping boss is smaller than that of the side away from the stopping boss.

With this structure, the floating performance of the second contact members can be further improved.

As a preferred technical solution, based on the limiting seat and the supporting seat, one side of the supporting seat away from the third housing is provided with a groove for partially embedding the stopping boss, and a gap is formed between one side of the supporting seat away from the third housing and the limiting seat.

The arrangement of the groove between one side of the supporting seat away from the third housing and the limiting seat also helps reduce the axial dimension of the second housing, and the space between one side of the supporting seat away from the third housing and the limiting seat can ensure elastic support for the stopping boss.

As a preferred technical solution, based on the limiting seat and the supporting seat, the second contact members are PCB contact members, and the stopping boss is formed by the ear plates disposed in the width direction and on both sides of the PCB contact members.

The PCB contact members are simple in structure and facilitates arrangement of the stopping boss.

As a preferred technical solution, guide columns are fixed on the third housing, one end of each guide column close to the second housing is provided with a stopping flange, the second housing is provided with counterbores, the guide columns pass through the counterbores, the annular steps of the counterbores are engaged with the stopping flanges, and radial floating spaces are provided between the bore walls of the counterbores and the outer circumferential surfaces of the stopping flanges.

Cooperation between the guide columns and the counterbores are simple in structure and convenient to implement.

As a preferred technical solution, based on the guide columns, the first housing is provided with guide posts for insertion into the counterbores, and the diameter of the guide posts is smaller than that of the counterbores.

As a preferred technical solution, the axial length of the second housing is less than 110 mm.

The technical solution of the present invention are more applicable to a connector having a relatively small axial length, preferably, an axial length less than 110 mm, and the larger the axial length of the second housing is, the more prone to skewing the second housing is when inserted, which may affect the translational motion of the second housing relative to the third housing.

The above-mentioned preferred technical solution may be adopted alone, and in the case of being able to be combined, two or more kinds of technical solutions may be used in any combination, and the technical solution formed by the combination are not described in detail herein, and are included in the disclosure of the present patent in this form.

BRIEF DESCRIPTION OF THE DRAWINGS

In FIGS. 9 and 10, the portions of the first contact members 3 and the third contact members 13 which are used for insertion fitting with the second contact members 8 are both represented in an unplugged state. It should be understood by those skilled in the art that when the plug and the socket are in the plugged state, the two ends of each second contact member 8 are actually sandwiched between the two side contact pieces of the corresponding first contact member 3 and between the two side contact pieces of the corresponding third contact member 13, and when displacement occurs in the second contact member 8 as shown in FIG. 10, the first contact member 3 and the third contact member 13 can be elastically deformed under the action of the second contact member 8.

Figure 1:
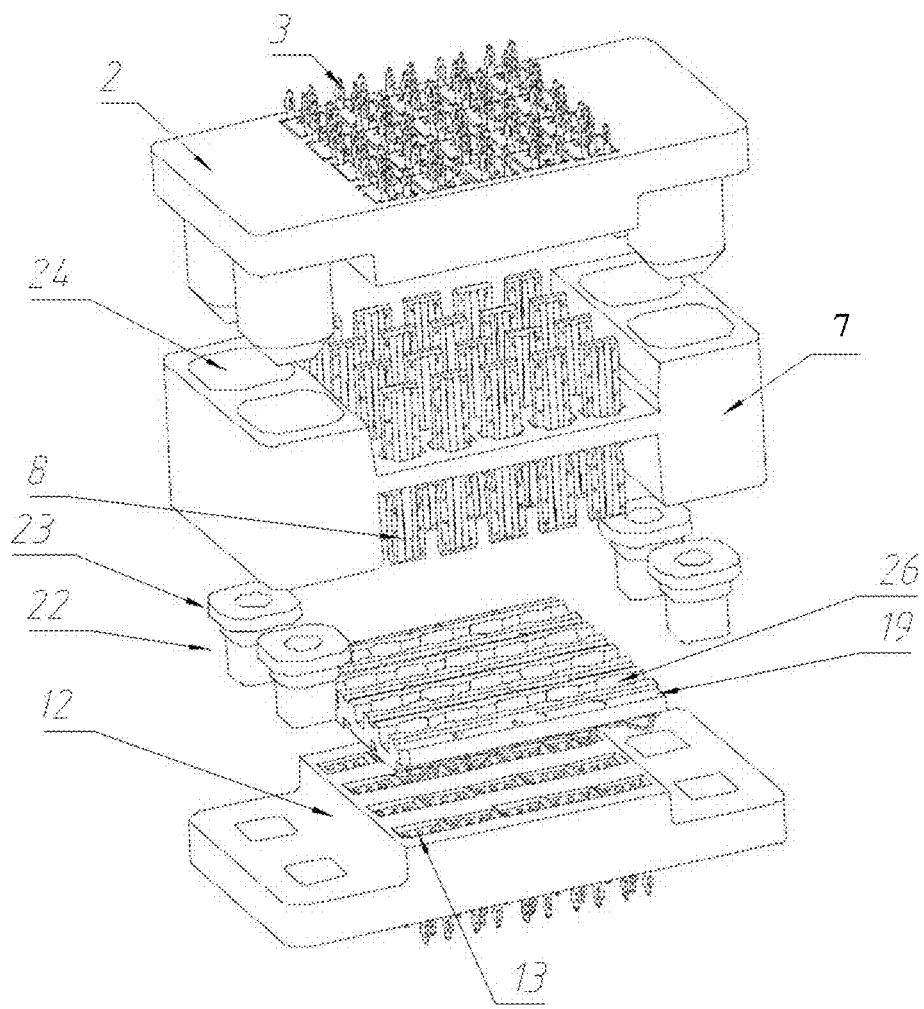
FIG. 1 is a perspective exploded view of one embodiment of the connector with the tolerance module in the present invention.
Figure 2:
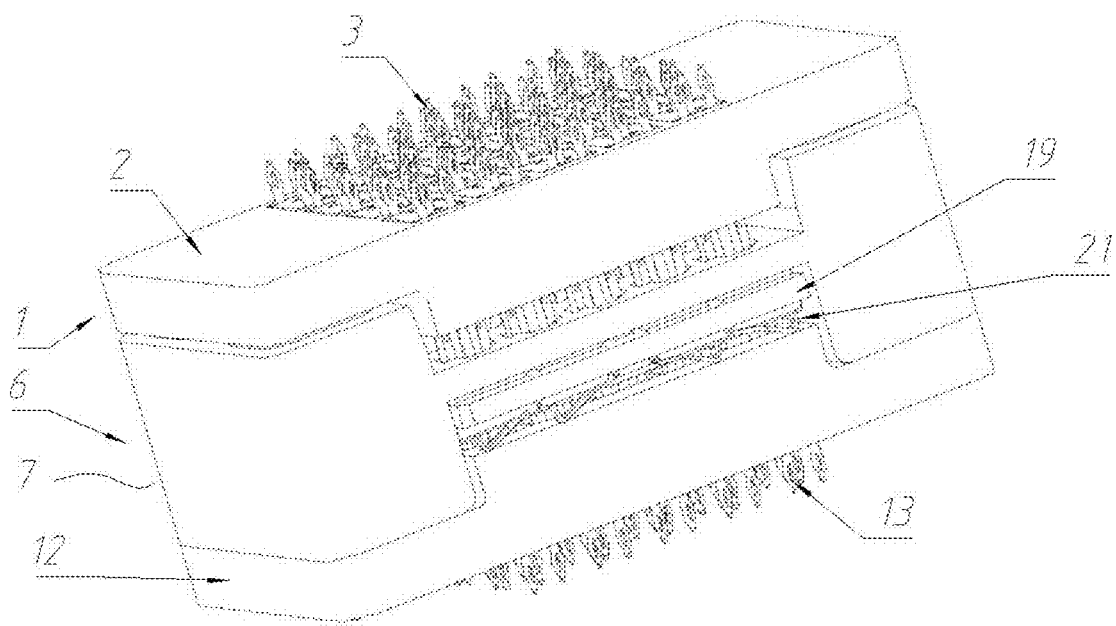
FIG. 2 is a perspective view of the plugged state of the plug and the socket in FIG. 1.
Figure 3:
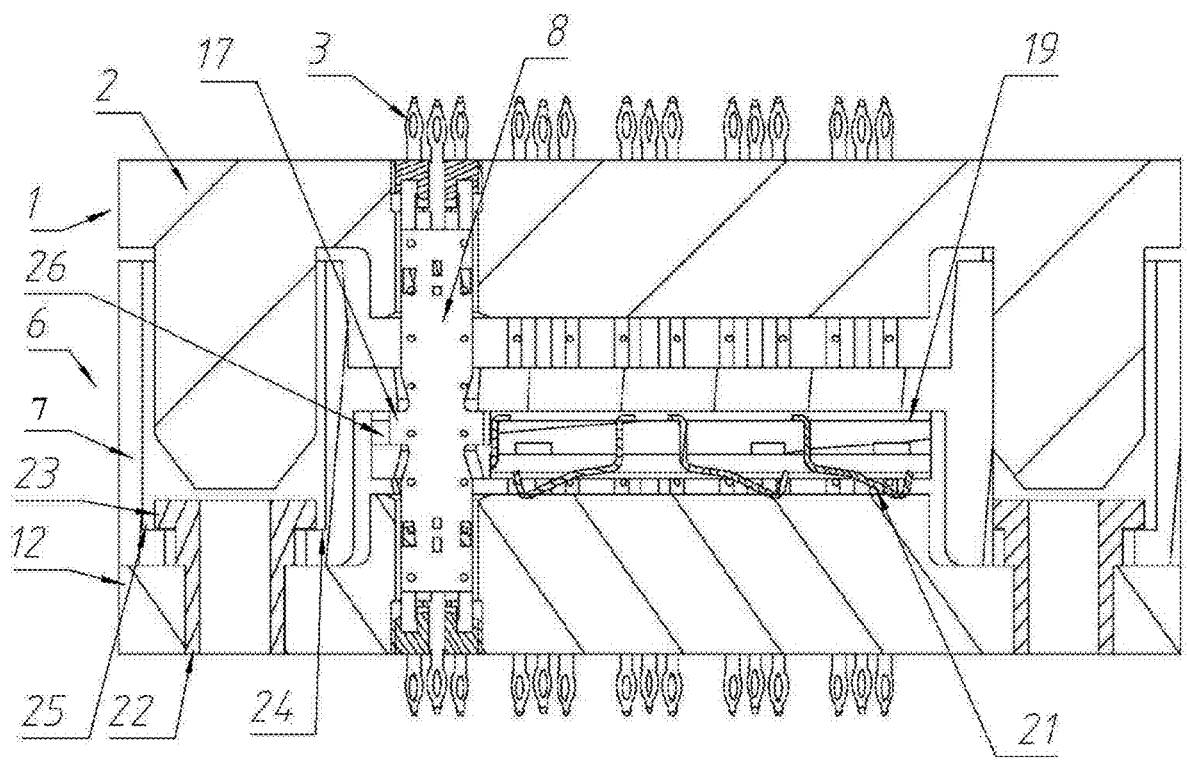
FIG. 3 is a sectional view of FIG. 2 (the second contact members are only partially shown)
Figure 4:
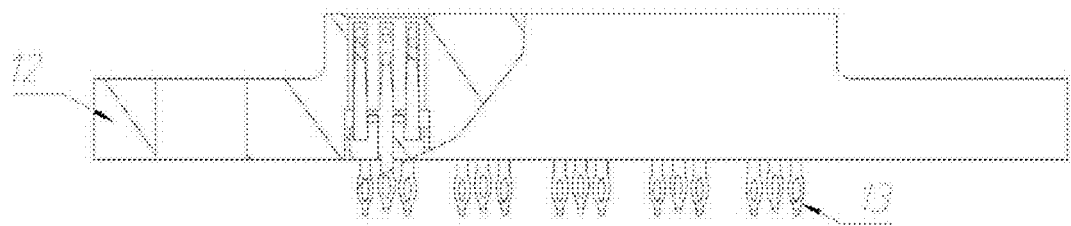
FIG. 4 is a schematic structural diagram of a connection module corresponding to the third housing in FIG. 3.
Figure 5:
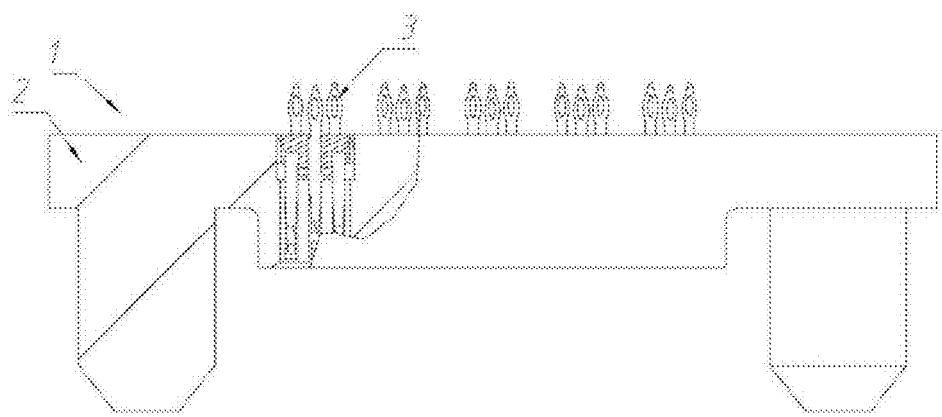
FIG. 5 is a schematic structural diagram of the plug corresponding to the first housing in FIG. 3.
Figure 6:
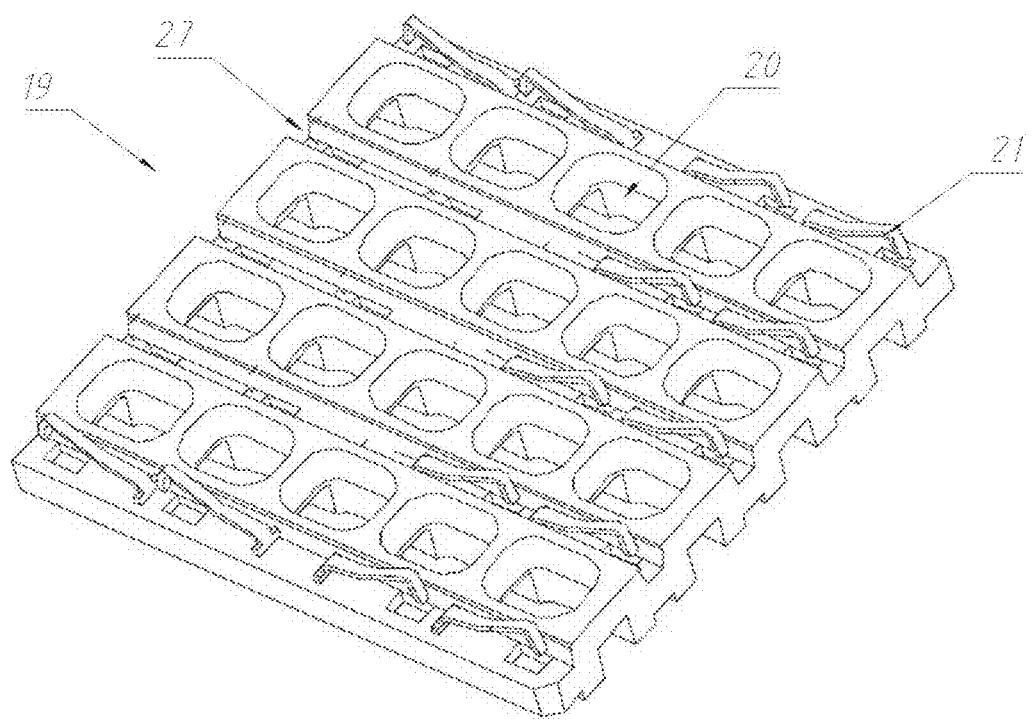
FIG. 6 is a perspective view of the supporting plate in FIG. 2.
Figure 7:
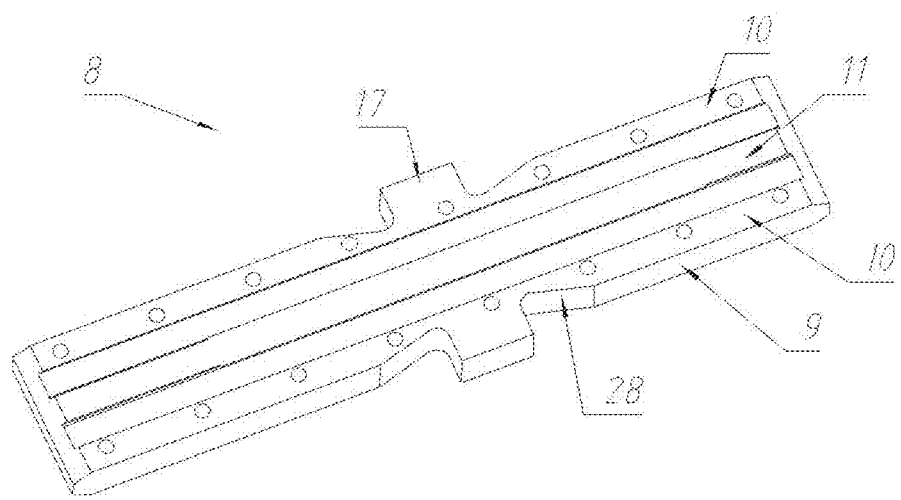
FIG. 7 is a perspective view of a PCB contact member.

In the drawings, the components corresponding to the corresponding reference numerals are designated as: 1—socket, 2—first housing, 3—first contact member, 4—ground pin, 5—signal pin, 6—plug, 7—second housing, 8—second contact member, 9—plate body, 10—ground contact piece, 11—signal contact piece, 12—third housing, 13—third contact member, 17—ear plate, 18—pressure plate, 19—supporting plate, 20—through hole, 21—elastic piece, 22—guide column, 23—stopping flange, 24—counterbore, 25—radial floating space, 26—groove, 27—elastic member accommodating groove, 28—reduced section.

DESCRIPTION OF EMBODIMENTS

The present invention will be further described below with reference to the drawings.

Figure 8:
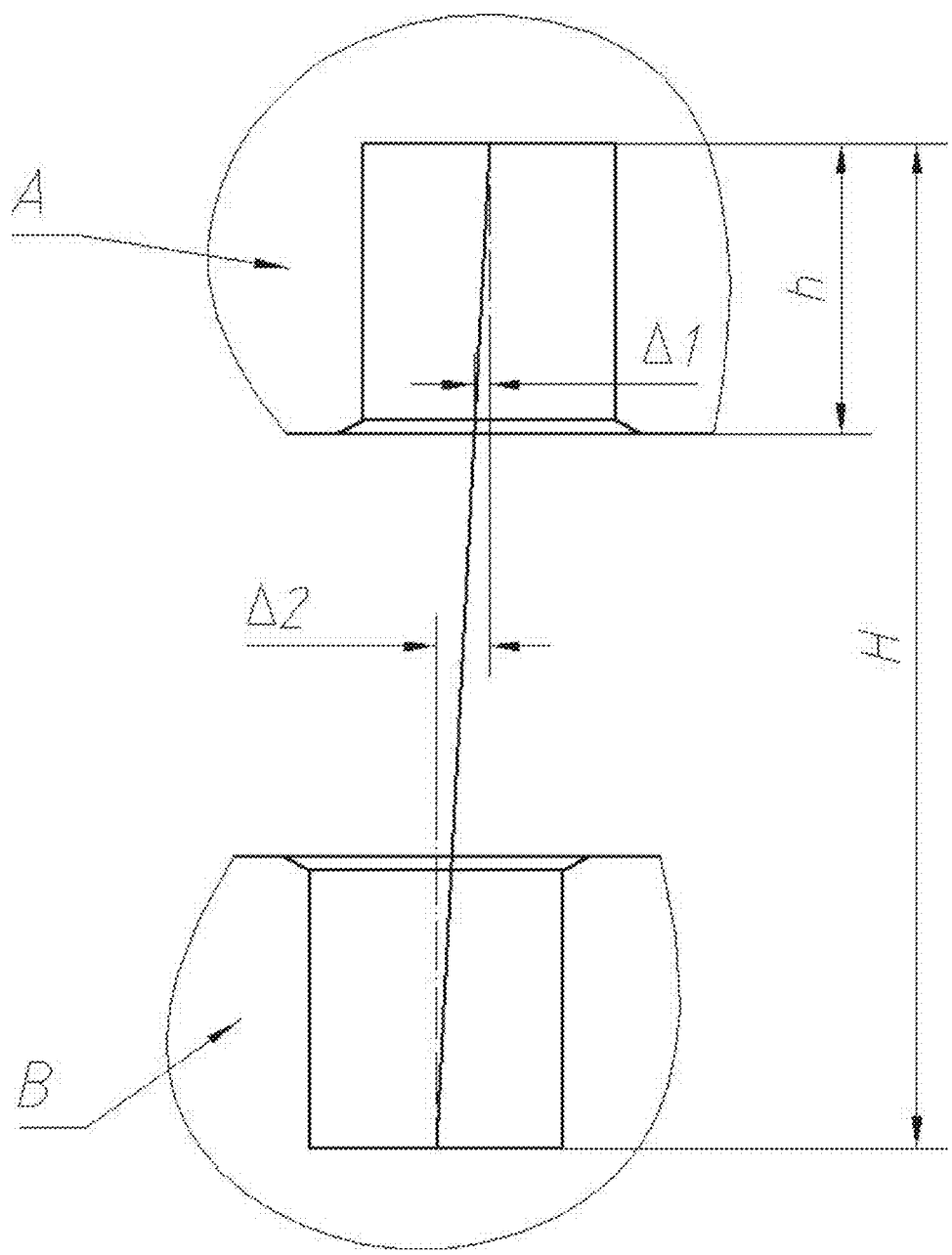
FIG. 8 is a schematic diagram of large displacement insertion.
Figure 9:
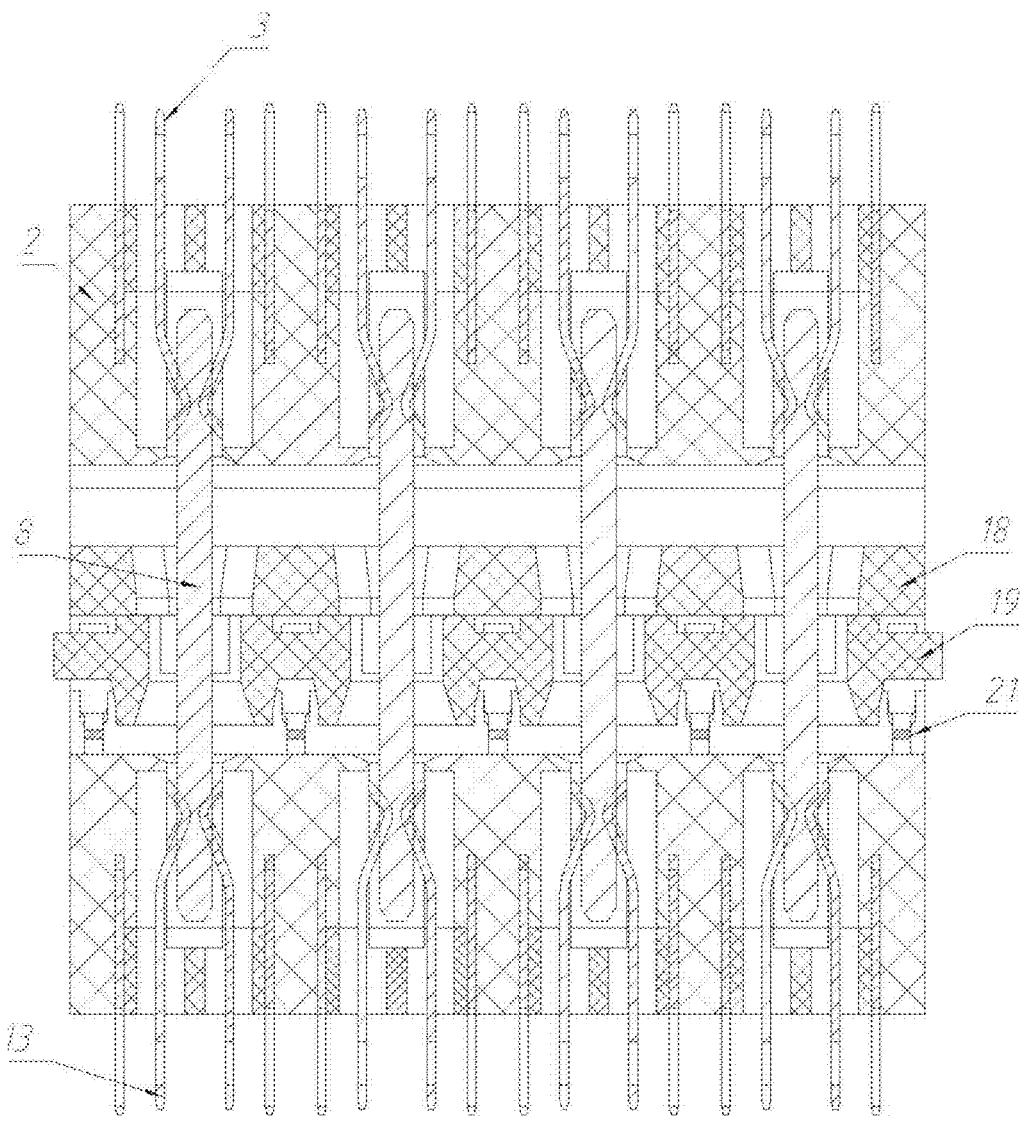
FIG. 9 is a schematic structural diagram of zero displacement plugging of the connector with the tolerance module.
Figure 10:
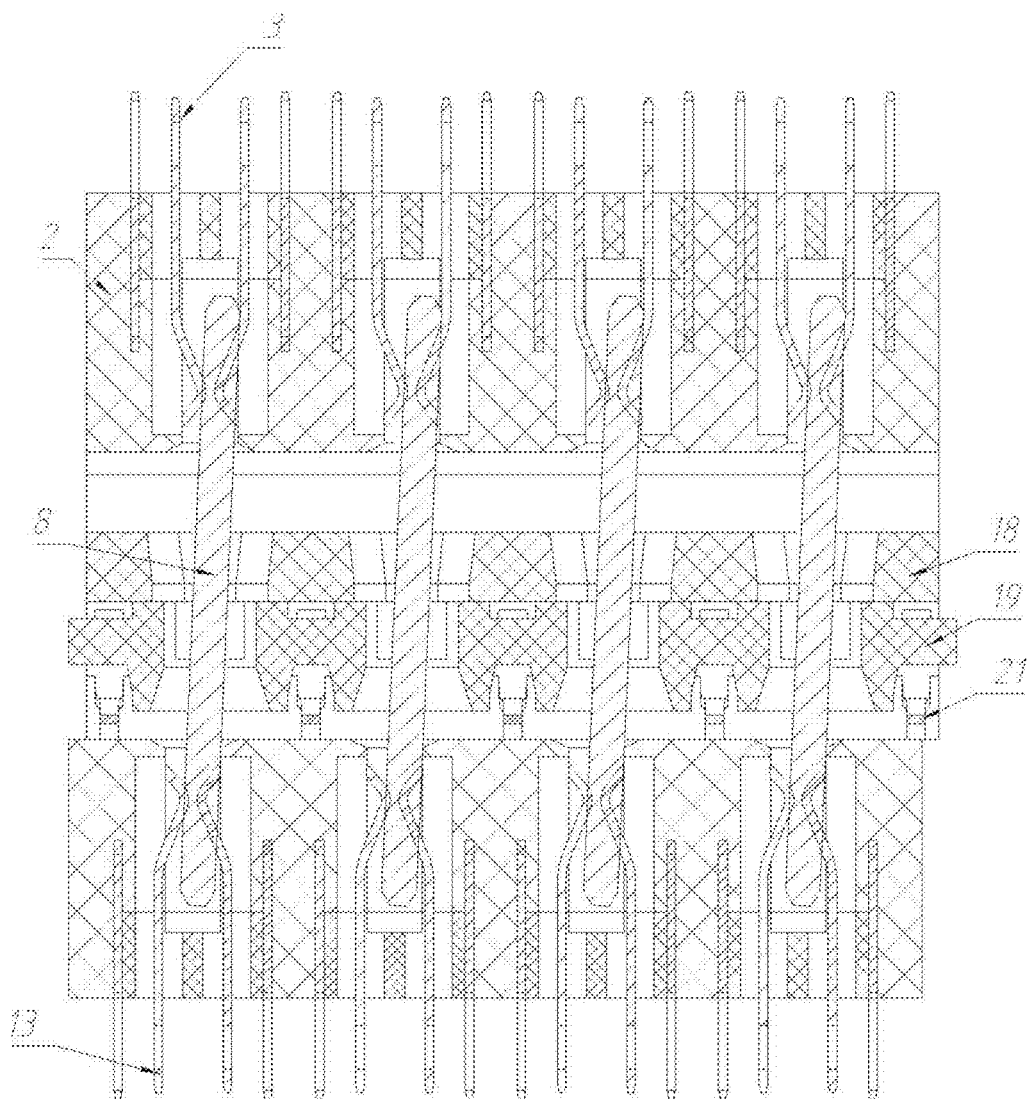
FIG. 10 is a schematic diagram of displacement of the connector with the tolerance module in the board interval direction of the PCB contact member.
Figure 11:
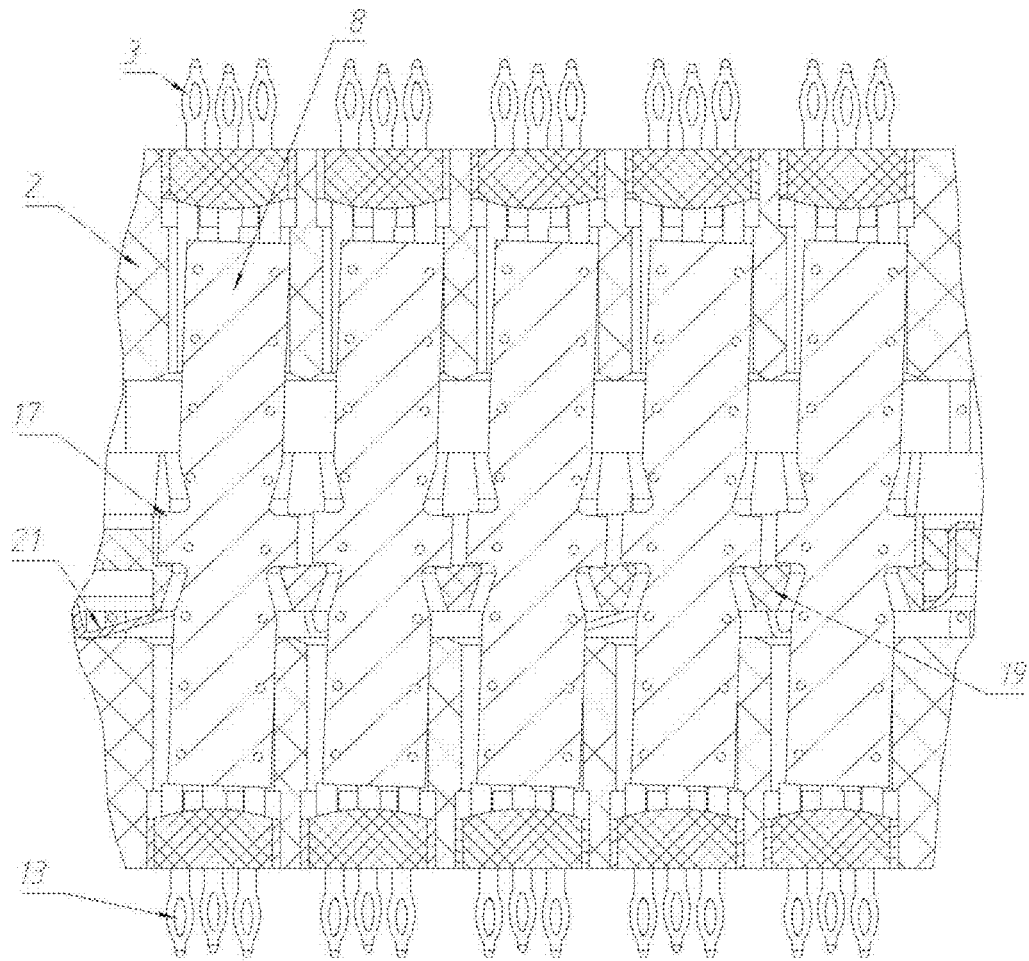
FIG. 11 is a schematic diagram of displacement of the connector with the tolerance module in the board extending direction of the PCB contact member.
Figure 12:
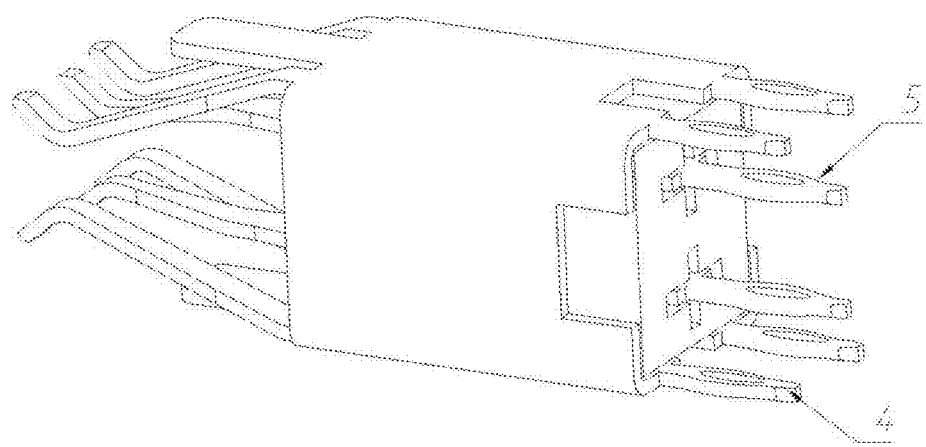
FIG. 12 is a schematic structural view of a first contact member and a third contact member.

One embodiment of the connector with the tolerance module according to the present invention is shown in FIG. 1 to 12 and is a differential connector, which belongs to high-density connectors. The connector is in a two-piece structure comprising a socket 1 and a plug 6 adapted to the socket 1, wherein the socket 1 comprises a first housing 2 and first contact members 3, the plug 6 comprises a second housing 7 and a third housing 12, the second housing 7 is internally provided with second contact members 8, the third housing 12 is provided with third contact members 13, and the second housing 7 and the second contact member 8 are used for forming the tolerance module. The formed tolerance module can play a role of leverage to reduce the displacement of the plugged part, and the adopted principle exists the prior art. As shown in FIG. 8, taking a parallel board connection mode (i.e., the circuit board connected to the plug 6 is parallel to the circuit board connected to the socket 1) for example, the horizontal displacement of the two parallel board connectors A is $\Delta 2$, the displacement of the connector plugging position is $\Delta 1$, the length of the contact member B of the tolerance module is H, and the distance from the end of the gold finger to the port of the connector is h in the case of nominal stacking height; and according to the similar triangular principle, $\Delta 1/\Delta 2 = h/H$, so that the actual displacement of the product during plugging can be reduced. In the present embodiment, the axial length of the second housing is less than 110 mm.

The second housing 7 is movably arranged on the third housing 12 in a direction perpendicular to the axial direction of the connector, and the second contact member 8 is floatingly assembled in the second housing 7. Specifically, the second contact members 8 are PCB contact pieces, of which the structure is shown as in FIG. 7. As a whole, the second contact member 8 is in a strip-shaped structure, and comprises a plate body 9. Both sides of the plate body 9 in the width direction are respectively provided with ground contact pieces 10, between which a signal contact piece 11 is arranged; correspondingly, the first contact member 3 and the third contact member 13 respectively comprise a ground pin 4 and a signal pin 5 arranged in the middle of the ground pin 4; ear plates 17 are arranged on both sides of the width direction of the middle of the length direction of the PCB board contact member, forming a stopping boss; The second housing 7 comprises a pressure plate 18 disposed on one side of the stopping boss away from the third housing 12, and further comprises a supporting plate 19 disposed on one side of the stopping boss close to the third housing 12, the pressure plate 18 forms a limiting seat, and the supporting plate 19 forms a supporting seat. The pressure plate 18 comprises a plate body and connecting blocks disposed on opposite sides of the plate body, and the two connecting blocks are connected to the plate body in the middle of the axial direction of the connector.

The plate body and the supporting plate 19 are provided with through holes 20 through which the second contact members 8 pass in a floating manner, the stopping boss is sandwiched between the pressure plate 18 and the supporting plate 19, axial floating spaces are formed between the supporting plate 19 and the third housing 12, and elastic supporting members are arranged between the supporting plate 19 and the third housing 12, and the elastic supporting members are elastic pieces 21 uniformly fixed on the supporting plate 19. Guide columns 22 are fixed on the third housing 12, one end of each guide column 22 close to the second housing 7 is provided with a stopping flange 23, the second housing 7 is provided with counterbores 24, each guide column 22 is arranged through the corresponding counterbore 24, the annular steps of the counterbores 24 is in stopping fit with the stopping flanges 23, and radial floating spaces 25 are formed between the bore walls of the counterbores 24 and the outer circumferential surfaces of the stopping flanges 23. Corresponding to the counterbores 24, the first housing 2 is provided with guide posts for insertion into the counterbores 24, the diameter of the guide posts is smaller than that of the counterbores 24, and the ends of the guide posts are provided with guide cones, which can play a guiding role during insertion.

One side of the supporting plate 19 away from the third housing 12 is provided with grooves 26 for partially embedding the stopping boss portion, and a gap is formed between one side of the supporting plate 19 away from the third housing 12 and the pressure plate 18. One side of the supporting plate 19 close to the third housing 12 is provided with elastic member accommodating grooves 27 for partially embedding the elastic supporting members.

In order to ensure smooth floating of the second contact members 8, the portion of each second contact member, which fits with the through holes on the plate body and the supporting plate, is a reduced section, and the radial dimension of the side of the reduced section 28 that is close to the stopping boss is smaller than that of the side away from the stopping boss.

When the plug 6 and the socket 1 of the connector are plugged to each other, the second housing 7 and the third housing 12 can move in a direction perpendicular to the axial direction of the connector, i.e. the second housing 7 is only capable of translating relative to the third housing 12 in a direction perpendicular to the axial direction of the connector. Meanwhile, due to the fact of being floatingly assembled in the second housing 7, each second contact member 8 can displace in the same manner during plugging, thereby achieving tolerance. Of course, in order to ensure that the second housing 7 and the third housing 12 can move smoothly, the above-mentioned "movement in a direction perpendicular to the axial direction of the connector" does not mean that the second housing 7 and the third housing 12 are completely tightly attached in the axial direction of the connector, and a small axial gap may be formed there between only to ensure that the second housing 7 and the third housing 12 can translate relative to each other but not to provide a floating space.

In the above-described embodiment, the second contact members 8 are elastically supported on the second housing 7 through the elastic supporting members, and in other embodiments of the present invention, the second contact members 8 can be floatingly disposed in a free state on the second housing 7. For example, the supporting plate 19 in the above-described embodiment can be fixed onto the pressure plate 18, enabling the second contact members 8 to be floatingly assembled in the second housing 7 under the cooperation of the stopping boss with the pressure plate 18 and the supporting plate 19 to achieve displacement in a direction perpendicular to the axial direction of the connector. Besides, in other embodiments, the second contact members 8 can be elastically pressed against the third housing 12, or elastic structures can be arranged on the axial both sides of the stopping boss of the second contact members 8, so as to achieve pressing in opposite directions. Furthermore, in other embodiments, the elastic supporting members can also be replaced by other forms such as coil springs, and can be arranged at the four corners of the supporting seat.

In the above-described embodiment, the second contact members 8 are provided with a stopping boss in the middle of the length direction, and in other embodiments, the stopping boss can be provided at a position close to the ends of the second contact members 8. Besides, in the above embodiment, the limiting seat is a pressure plate 18, the supporting seat is a supporting plate 19, and the plate body of the pressing plate 18 is in the middle of the limiting seat. In other embodiments, the limiting seat and the supporting seat can also be replaced with other forms such as a block structure, and the fitting position of the pressure plate 18 and the second contact member 8 can also be disposed on the side of the second housing 7 close to or away from the third housing 12.

In the above-described embodiment, the second housing 7 and the third housing 12 are movably arranged in a direction perpendicular to the axial direction of the connector by means of guide columns 22 fixed to the third housing 12, and in other embodiments, the guide columns 22 may also be arranged on the second housing 7. In addition, in other embodiments, the guide post 22 may also be replaced with other forms, for example, screws, which can achieve axial limitation through the screw heads.

In the above-described embodiment, the second contact members 8 are PCB contact members, and in other embodiments, the second contact members 8 can be replaced with another form such as columnar contact members.

Figure 13:
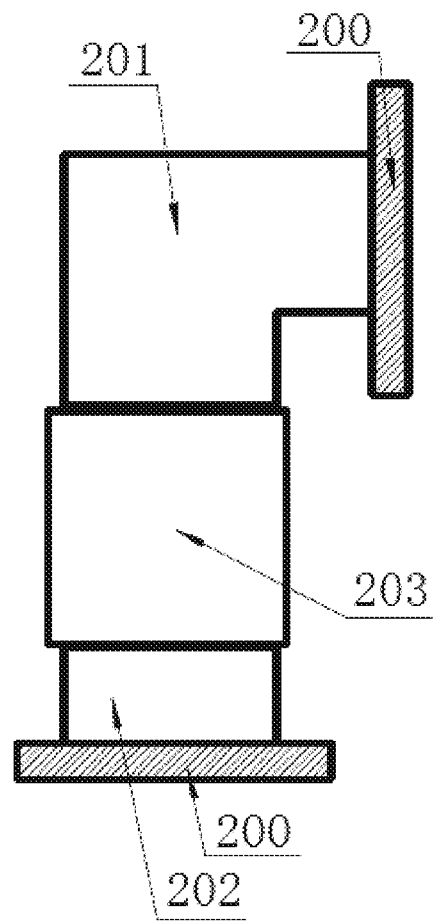
FIG. 13 to 15 are schematic diagrams of use states of other three embodiments of the connector with the tolerance module in the present invention.
Figure 14:
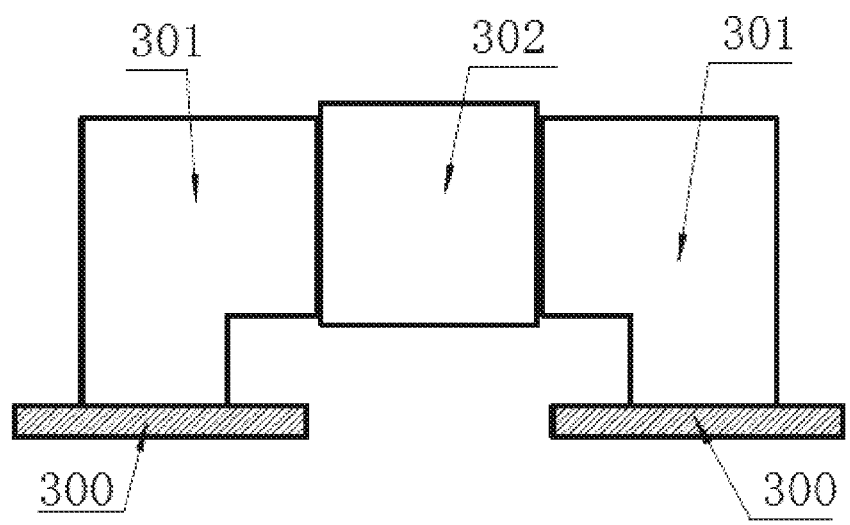
Figure 15:
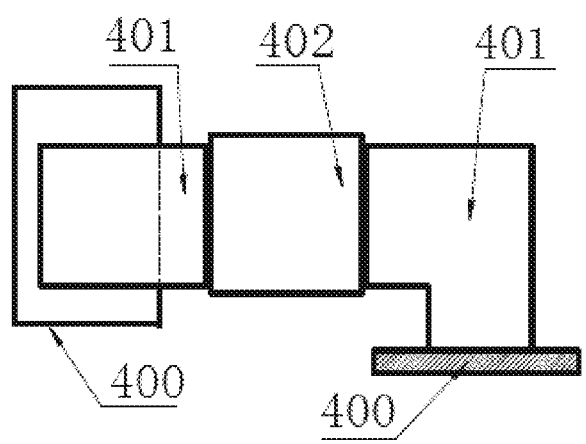

In the above-described embodiment, the connector is used as a parallel board connector, and in other embodiments, the connector can also be used on other occasions such as a backplane connector in the prior art (as shown in FIG. 13, in which two mutually perpendicular printed boards 200 are respectively provided with an L-shaped board end connector 201 and a straight board end connector 202, one of the two printed boards 200 is parallel to the plugging direction of the connector, the other is perpendicular to the plugging direction of the connector, the plugging portions of the L-shaped board end connector 201 and the straight board end connector 202 are arranged opposite to each other, a tolerance module 203 is arranged between the plugging portions of the L-shaped board end connector 201 and the straight board end connector 202, and the structures of the plugging portion of the L-shaped board end connector 201, the plugging portion of the straight board end connector 202 and the tolerance module 203 are the same as those in the first embodiment), a common panel connector used in the prior art (as shown in FIG. 14, in which two coplanar printed boards 300 are respectively provided with an L-shaped board end connector 301 and are both parallel to the plugging direction of the connector, the plugging portions of the two L-shaped board end connectors 301 are arranged opposite to each other, a tolerance module 302 is arranged between the two L-shaped board end connectors 301, and the structures of the plugging portions of the two L-shaped board end connectors 301 and the tolerance module 302 are the same as those in the first embodiment) and an orthogonal board connector used in the prior art (as shown in FIG. 15, in which two mutually perpendicular printed boards 400 are respectively provided with an L-shaped board end connector 401 and are both parallel to the plugging direction of the connector, the plugging portions of the two L-shaped board end connectors 401 are arranged opposite to each other, a tolerance module 402 is arranged between the two L-shaped board end connectors 401, and the structure of the plugging portions of the two L-shaped board end connectors 401 and the tolerance module 402 are the same as those in the first embodiment).

It should be noted that the above descriptions are only preferred embodiments of the present invention, and are not intended to limit the present invention. Although the present invention has been described in detail with reference to the foregoing embodiments, those skilled in the art are still allowed to make modifications to the technical schemes described in the foregoing embodiments without involving any creative effort, or make equivalent replacements to some technical features thereof. Any modifications, equivalent replacements, improvements, etc. made within the spirit and principle of the present invention should fall within the scope of protection of the present invention.

The invention claimed is:

1. A connector with a tolerance module, comprising a socket and a plug adapted to the socket, the socket comprising a first housing, the plug comprising the tolerance module and a third housing, the tolerance module comprising a second housing, the second housing being internally provided with second contact members, wherein the second housing is movably arranged on the third housing in a direction perpendicular to an axial direction of the connector, and the second contact member is floatingly assembled in the second housing to enable displacement in the direction perpendicular to the axial direction of the connector, the second contact members are provided with a stopping boss, the second housing comprises a limiting seat disposed on one side of the stopping boss away from the third housing, a supporting seat is disposed on one side of the stopping boss away from the limiting seat, through holes for allowing the second contact members to pass through in a floating manner are formed in the limiting seat and the supporting seat, and the stopping boss is limited between the limiting seat and the supporting seat, the stopping boss is sandwiched between the limiting seat and the supporting seat, and the supporting seat is elastically supported on the stopping boss of the second contact members, the supporting seat and the limiting seat are separately arranged, an axially floating space is formed between the supporting seat and the third housing, elastic supporting members are arranged between the supporting seat and the third housing, and the supporting seat is elastically supported on the stopping boss of the second contact members by means of the elastic supporting members.

2. The connector with the tolerance module according to claim 1, wherein the elastic supporting members are elastic pieces uniformly fixed on the supporting seat.

3. The connector with the tolerance module according to claim 1, wherein one side of the supporting seat close to the third housing is provided with elastic member accommodating grooves for partially embedding the elastic supporting members.

4. The connector with the tolerance module according to claim 1, wherein the limiting seat comprises a plate body and connecting blocks disposed on opposite sides of the plate body, wherein the two connecting blocks are connected to the plate body in the middle of the axial direction of the connector, and the second contact members penetrate through the plate body.

5. The connector with the tolerance module according to claim 1, wherein the stopping boss is disposed in the middle of the length direction of the second contact members.

6. The connector with the tolerance module according to claim 5, wherein the supporting seat is a supporting plate, a portion of each second contact member, which fits with the through holes on a plate body and the supporting plate, is a reduced section, and a radial dimension of a side of the reduced section that is close to the stopping boss is smaller than that of a side away from the stopping boss.

7. The connector with the tolerance module according to claim 1, wherein one side of the supporting seat away from the third housing is provided with a groove for partially embedding the stopping boss, and a gap is formed between one side of the supporting seat away from the third housing and the limiting seat.

8. The connector with the tolerance module according to claim 1, wherein the second contact members are PCB contact members, and the stopping boss is formed by the ear boards disposed in the width direction and on both sides of each PCB contact member.

9. The connector with the tolerance module according to claim 1, wherein guide columns are fixed on the third housing, one end of each guide column close to the second housing is provided with a stopping flange, the second housing is provided with counterbores, the guide columns pass through the counterbores, annular steps of the counterbores are engaged with the stopping flange, and radial floating spaces are provided between the bore walls of the counterbores and the outer circumferential surfaces of the stopping flanges.

10. The connector with the tolerance module according to claim 9, wherein the first housing is provided with guide posts for insertion into the counterbores, and the diameter of the guide posts is smaller than that of the counterbores.

11. A connector with the tolerance module according to claim 1, wherein the second housing has an axial length less than 110 mm.

* * * * *